United States Patent [19]
Wotherspoon

[11] 4,411,732
[45] Oct. 25, 1983

[54] METHOD OF MANUFACTURING A DETECTOR DEVICE

[75] Inventor: John T. M. Wotherspoon, Southampton, England

[73] Assignee: U.S. Philips Corporation, New York, N.Y.

[21] Appl. No.: 355,440

[22] Filed: Mar. 3, 1982

[30] Foreign Application Priority Data

Mar. 27, 1981 [GB] United Kingdom ............. 8109774

[51] Int. Cl.³ .............. H01L 21/306; B44C 1/22; C03C 15/00; C03C 25/06
[52] U.S. Cl. ........................... 156/643; 29/572; 29/576 B; 148/1.5; 148/187; 156/648; 156/655; 156/659.1; 204/192 E; 204/192 N; 357/30
[58] Field of Search ............. 156/628, 643, 648, 649, 156/655, 659.1, 662; 148/1.5, 187; 29/572, 576 B; 204/192 N, 192 E, 192 R; 357/17, 19, 29, 30; 427/85, 86, 38

[56] References Cited

U.S. PATENT DOCUMENTS

| 4,128,467 | 12/1978 | Fischer | 204/192 |
| 4,301,591 | 11/1981 | Withers | 156/643 X |
| 4,310,583 | 1/1982 | Baker et al. | 428/209 |
| 4,321,615 | 3/1982 | Blackman et al. | 357/30 |

OTHER PUBLICATIONS

"Properties of Ion-Implanted Junctions in Mercury-Cadmium-Telluride," A. Kolodny et al., *IEEE Trans. on Electron Devices*, vol. ED-27, No. 1, Jan. 1980, pp. 37-43.

*Primary Examiner*—William A. Powell
*Attorney, Agent, or Firm*—Marc D. Schechter

[57] ABSTRACT

In the manufacture of an infrared radiation detector device, a body of p-type cadmium mercury telluride is bombarded with ions to etch away a part of the body. From the etched-away part of the body an excess concentration of mercury is produced which acts as a dopant source converting an adjacent part of the body into n-type material. The energy of the bombarding ions is less than 30 keV. By appropriately choosing the ion dose this conversion from p-type to n-type can be effected over a depth considerably greater than the penetration depth of the ions. A p-n junction can be fabricated in this way for a photovoltaic detector. The conductivity type conversion may even be effected through the body thickness. The etching and conversion can be localized by masking part of the body surface against the ion bombardment.

8 Claims, 8 Drawing Figures

1-III PHB 32766

METHOD OF MANUFACTURING A DETECTOR DEVICE

BACKGROUND OF THE INVENTION

This invention relates to methods of manufacturing an infrared radiation detector device of cadmium mercury telluride. The invention further relates to detector devices manufactured by such methods.

In a paper entitled "Properties of Ion-Implanted Junctions in Mercury-Cadmium Telluride" by A. Kolodny et al (I.E.E.E. Transactions on Electron Devices, Vol. ED-27, pages 37 to 42) an experimental method of manufacturing a detector device is disclosed. The method comprises the steps of (a) providing a body of cadmium mercury telluride, at least a portion of which has conductivity characteristics of p-type material at the operating temperature of the device, and (b) bombarding at least a part of the surface of the body with ions to convert a part of the body portion into material having conductivity characteristics of n-type material at the operating temperature of the device. In the experimental method the ion bombardment was effected in an ion implantation machine with ion doses of between $10^{13}$ and $10^{15}$ ions per cm$^2$ at energies of 100 keV to 300 keV to form p-n junctions in the body at a depth which was typically less than 1 micron and which was determined by the implantation depth of the ions in the body.

The effect of implanting different ion species was studied by using argon, boron, aluminium and phosphorus ions. The authors of the paper obtained essentially the same results from the implantation of all these different species and concluded that implantation damage (i.e. lattice defects) adjacent the body surface was the primary cause for converting the p-type cadmium mercury telluride surface to material having n-type characteristics. These experimental results are in conflict with those produced by some other workers in the art and do not appear to provide a readily reproducible method for the manufacture of reliable infrared radiation detector devices on a large scale. Furthermore ion implantation equipment is expensive to purchase and expensive both to house and to maintain fully operational in a manufacturing environment.

SUMMARY OF THE INVENTION

According to the present invention there is provided a method of manufacturing an infrared radiation detector device of cadmium mercury telluride. The method comprises the steps of (a) providing a body of cadmium mercury telluride, at least a portion of which has conductivity characteristics of p-type material at the operating temperature of the device, and (b) bombarding at least a part of a surface of the body with ions to convert at least a part of the body portion into material having conductivity characteristics of n-type material at the operating temperature of the device. In the method according to the invention, the ion bombardment is effected using ion etching to etch away a part of the body at the bombarded surface. The dose, energy and mass of the bombarding ions are such that adjacent the bombarded surface a sufficient excess concentration of mercury is produced from the etched-away part of the body as to act as a dopant source for converting an adjacent part of the body into material having the n-type conductivity characteristics. The ion dose is sufficiently large to convert the adjacent part of the body over a depth greater than twice the ion penetration depth in the said body. The energy of the bombarding ions is less than 30 keV.

Surprisingly, Applicant has found that by etching a body of cadmium mercury telluride in this manner with ions of less than 30 keV the adjacent part of the p-type body portion can be converted into n-type material over a depth greater than twice the ion penetration depth and in a manner which is sufficiently reproducible and reliable for large-scale manufacture of infrared detector devices. Surprisingly, it has been found that by increasing the ion dose it is readily possible to effect the conductivity type conversion over depths which are considerably larger than the depth over which the body is etched away by the ions and considerably larger than any penetration depth of the ions at the bombarded surface. Thus, by using an appropriate ion dose (as determined by the ion-beam current density and etching time) the conversion depth which is obtained may be, for example, more than three times the penetration depth and very much larger, for example at least five times, ten times, a hundred times or even a thousand times the penetration depth of the ions. As will be described more fully hereinafter, this form of conductivity type conversion appears to result from diffusion of an excess concentration of mercury produced from the etched-away part of the body and is thought to be peculiar to cadmium mercury telluride. A further advantage of such methods according to the invention is that instead of requiring expensive high voltage ion implantation equipment, the ion bombardment is effected using ion-etching equipment which requires less factory area, can be easier to maintain and cheaper to purchase.

Such methods according to the invention may be used to form p-n junctions for photovoltaic detectors having junction depths 1 micron and more, for example at least 2 microns and even very much larger, for example 5 or 10 microns. As described hereinafter, the conductivity type conversion may even be effected throughout the thickness of a cadmium mercury telluride body so that the body is converted into n-type material over its whole its thickness.

By using masking materials such as photoresist which are commonly used to mask against ion-etching it is possible to restrict the conductivity type conversion to a region adjoining a localized area of a body surface so that a p-n junction is formed which extends from the surface.

BRIEF DESCRIPTION OF THE PREFERRED EMBODIMENTS

Figure 1:
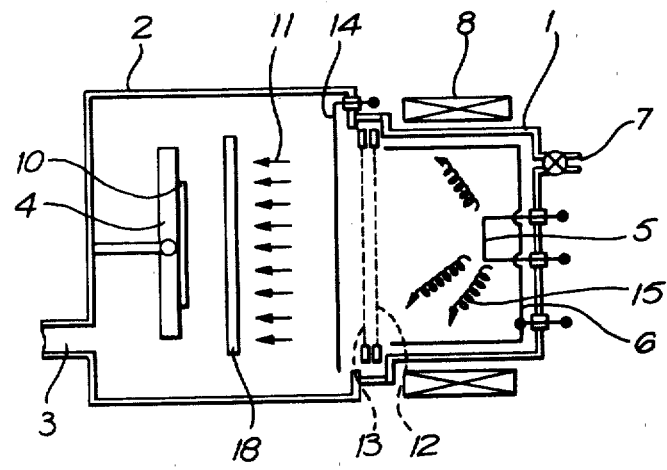
FIG. 1 is a diagrammatic sectional view of an ion-beam etching system such as may be used to manufacture an infrared radiation detector device by a method according to the invention.

It is is already known to use ion-etching (for example using an ion-beam at least part of which may be neutralized with electrons) to remove n-type cadmium mercury telluride material and metallization for the purposes of (a) separating photoconductive detector elements and their electrodes in an array, (b) providing mesa contacting of such detector elements, and (c) providing a meandering current path in such detector elements. These techniques together with some general information on ion-etching characteristics and equipment are described in the specifications of W. German patent application (DE) 2708792A (corresponding to U.S. Pat. No. 4,128,467) and European patent applications (EP) 0 007 667, 0 007 668 and 0 007 669 (corresponding to U.S. Pat. Nos. 4,310,583, 4,301,591 and 4,321,615).

Suitable ion-etching equipment for microminiature solid-state device manufacture is also commercially available from several equipment suppliers, for example "Microetch" Ion Beam Milling systems are available under the trade name "Microetch" from Veeco Instruments Inc. of Plainview, New York in the U.S.A., and other ion-milling systems are available from Ion Tech. Inc. of Fort Collins, Colorado in the U.S.A. One example of such ion-beam etching equipment which is suitable for use in methods according to the present invention is shown in a very schematic and basic form in FIG. 1.

The equipment is in the form of a double vacuum chamber 1 and 2 which is evacuated via a pumping port 3 by, for example, a diffusion pump. The body 10 which is to be etched by an ion beam 11 is mounted on an electrically-isolated target holder 4 in the work chamber 2. This target holder 4 may be, for example, water-cooled and/or rotatable in the chamber 2 so that the temperature of the body 10 and angle of incidence of the ion beam 11 can be controlled as desired during ion bombardment.

The ions forming the beam 11 are generated in the source chamber 1 using a low-pressure gas discharge between a heated cathode 5 and a surrounding cylindrical anode 6. The gas to be ionized (usually argon) is introduced into the chamber 2 via a variable leak valve 7 at a typical pressure of, for example, $10^{-3}$ torr to $5 \times 10^{-4}$ torr. The gas is ionized by electrons 15 from the cathode 5 which are accelerated in the radial electric field (for example 30 to 60 eV) between the cathode 5 and anode 6. As indicated in FIG. 1 a solenoid magnet 8 is present around the chamber 1 so that the electrons 15 move in cycloidal trajectories in a magnetic field thereby enhancing the ionization efficiency at low pressures.

The source chamber 1 (and in particular the cylindrical anode 6) is held at a moderately high positive potential (which is less than 10 kV) to accelerate, extract and focus the ions from the chamber 1 as a beam 11, via a set of two or more optically-aligned acceleration grids 12 and 13. The first grid 12 which is at the anode potential forms a permeable wall of the discharge chamber 1, while the second grid 13 which is at a negative potential (for example $-250$ V) prevents electrons from travelling from the chamber 1 through the grid system 12 and 13 and provides the accelerating and focussing voltage for the ion beam 11.

A filament 14 located beyond the grid system 12 and 13 and immersed in the ion beam 11 emits electrons into the beam 11 to neutralize the positive space charge of the beam 11 thereby reducing its electrostatic divergence and thereby substantially balancing the surface charge on the body 10 bombarded by the beam 11. The body 10 is thus etched in a substantially field-free and plasma-free environment. A movable shutter 18 is present in the chamber 2 and can be moved into the path between the chamber 1 and the target holder 4 to interrupt the beam 11 thereby permitting easy control of the bombardment time. This is particularly important for short bombardment times.

Such ion-beam etching equipment may use voltages of up to 5 kV (depending on the type of equipment) to produce argon ion beams 11 of up to 5 keV energy. Depending again on the type of equipment, ion beam currents of up to 1.5 milliAmps/cm$^2$ may be used, corresponding to approximately $10^{16}$ ions per cm$^2$ per sec. Such equipment operates at significantly lower voltages than ion-implantation machines (typically above 100 keV) and is considerably less complicated, easier to maintain fully operational, easier to house, and cheaper to purchase.

Figure 2:
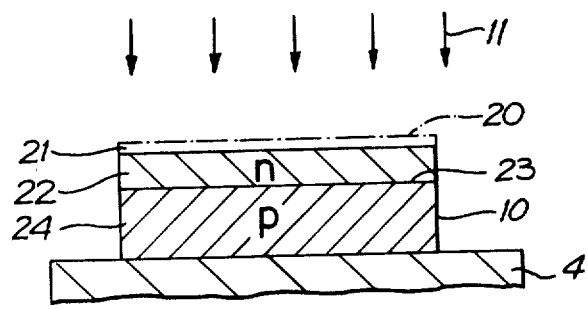
FIG. 2 is a diagrammatic sectional view of part of a body of cadmium mercury telluride being subjected to an ion-etching step in a method acording to the invention.

FIG. 2 illustrates the use of such ion-beam etching equipment in the manufacture of an infrared radiation detector device according to the present invention. As illustrated in FIG. 2, a body 10 of cadmium mercury telluride mounted on the target holder 4 is bombarded by the ion beam 11 in the target chamber 2 of such ion-beam etching equipment. Although not shown in FIG. 2, the body 10 will often be present on a supporting substrate (for example sapphire), so that this substrate rather than the body 10 will directly contact the target holder 4.

The body 10 as originally provided has the conductivity characteristics of p-type material at least at the operating temperature of the device. For a detector operating in the 8 to 14 micron wavelength band of radiation, the operating temperature is usually 77° K., whereas the operating temperature for detectors in the 3 to 5 micron band may even be as high as room temperature. The original upper surface of the original p-type body 10 is indicated by the broken line 20 in FIG. 2.

In the arrangement shown in FIG. 2 the whole upper surface 20 of the body 10 is bombarded with the ions 11 in such a way as to etch away a part 21 of the body 10 at the whole surface 20 and to convert an underlying part 22 of the body 10 into material having conductivity characteristics of the n-type at the operating temperature of the device. In order to achieve this conductivity type conversion using the ion-beam etching equipment, the dose, energy and mass of the bombarding ions of the beam 11 are chosen such that adjacent the bombarded surface a sufficient excess concentration of mercury is produced from the etched-away part 21 as to act as a donor-dopant diffusion source for overdoping the acceptor-levels in the adjacent part 22 over a depth (d) which is greater than twice the penetration depth of the ions in the body 10. The ion bombardment energy is considerably less than 30 keV. A total argon ion dose of more than $10^{15}$ ions per cm$^2$ is used.

Figure 4:
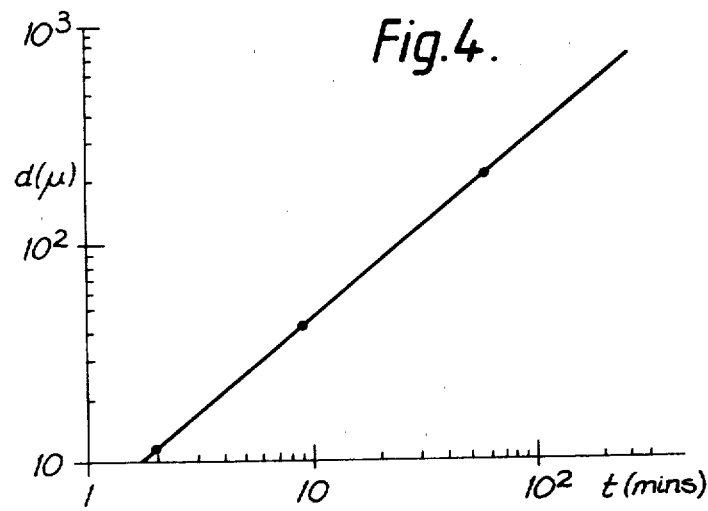
FIG. 4 is a graph showing the increase in the conversion depth (d in microns) with ion-etching time (t in minutes).

In one example, the starting material is a p-type cadmium mercury telluride body 10 having an acceptor concentration of $10^{16}$ cm$^{-3}$ and a mobility of $2\times10^3$ cm$^2$V$^{-1}$ sec$^{-1}$. This body 10 was bombarded in a VEECO "Microetch" system, with a beam current of 600 microAmps per cm$^2$ of 500 eV neutralized argon ions. This beam current corresponds to an ion dose per minute of approximately $2\times10^{17}$ ions per cm$^2$. During the bombardment, the target-holder 4 was water-cooled at a temperature of approximately 10° C. By bombardment in this way the p-type material was converted to n-type at a rate given by the graph of FIG. 4. In FIG. 4, t is the bombardment time in minutes whereas d is the thickness of the resulting n-type part 22 (i.e. not including the thickness of the part 21 which was etched away). When the n-type converted part 22 does not extend over the whole thickness of the body 10 it forms a p-n junction 23 with the remaining p-type part 24 so that d in this case is also the depth of this p-n junction in the etched body.

As can be seen from FIG. 4 the conversion depth d in this example was found to be approximately proportional to $t^{0.85}$. A two-minute bombardment produced a 10 micron thick n-type layer 22, whereas a 60 minute bombardment produced an n-type layer 22 of just over 200 microns thickness. Thus apart from the thickness of the part 21 which is etched away, the technique can be used to convert a p-type cadmium mercury telluride body into n-type material over its whole thickness. The thickness of the body part 21 etched under those conditions is approximately 0.5 microns in 2 minutes and approximately 15 microns in 60 minutes. By comparison with the conversion depth (d), the penetration depth of the 500 eV argon ions in the body 10 is very small (approximately 0.2 microns). The resulting average donor concentration in the n-type layer 22 was measured as $1.4\times10^{15}$ cm$^{-3}$ and the mobility was $9.6\times10^4$ cm$^2$V$^{-1}$ sec$^{-1}$.

Therefore, not only are the results obtained according to the invention using equipment which is much more convenient than ion-implantation equipment very surprising, but much larger junction depths and conversion depths can be obtained according to the invention, as compared with using ion implantation either to dope the material or to damage the lattice.

According to the present invention a lower ion energy (compared with implantation) is used so that when a significant part 21 of the body 10 is etched-away some of the mercury from the etched-away part 21 is driven into the body 10 as dopant interstitials in the crystal lattice. The surprisingly large conversion depths obtained indicate that this interstitial mercury is formed in a sufficiently large excess concentration as to move further into the body 10 by a diffusion process during the ion-etching. Without such diffusion the conversion depth would merely be of approximately the same order of magnitude as the penetration depth of the ions (approximately 0.2 microns for 500 eV argon ions) and would not increase with time in the manner found.

The conductivity type conversin effect can be represented by the following very simplified model. This model assumes a linear gradient of interstitial mercury in the converted part 22 from a high concentration $n_o$ at the bombarded surface of part 22 to a lower concentration which occurs at the p-n junction 23 and which equals the acceptor level concentration $p_o$ in the remaining part 24 of the body 10. It should be noted that this assumption and the simplified model are not an accurate representation of what occurs. Nevertheless the model does offer some assistance in understanding the conversion effect which is obtained in practice.

Using this model, the following equations can be obtained:

$$G = \delta N/\delta t = D.(n_o/d) \qquad (1)$$

where G is the rate of generation of interstitial mercury at the bombarded surface, N is the concentration of interstitial mercury generated, t is the bombardment and etching time, D is the diffusion coefficient of the interstitial mercury in the cadmium mercury telluride body 10, and d is the thickness of the n-type converted part 22. However, $$\delta d/\delta t = (\delta N/\delta t)(1/p_o) = G/p_o \qquad (2)$$

Hence,
$$d = (G/p_o)t. \qquad (3)$$

Equation (3) represents a conversion depth (d) which is linear in time (t) and increases at a rate given by $(G/p_o)$. Thus, large conversion depths (and for example deep p-n junctions) can be obtained by having a high generation rate (G) and a low original acceptor doping concentration ($p_o$). Furthermore, equation (3) gives a conversion rate which is independant of the diffusion coefficient (D) and hence of the temperature. The linear conversion rate of equation (3) compares reasonably well with the experimental results of FIG. 4 for which the conversion depth (d) was found to increase approximately proportional to $t^{0.85}$.

From equation (1) and this simplified model, the converted part 22 has a very high surface concentration of interstitial mercury, $n_o$, given by:

$$n_o = G.d/D = G^2.t/(D.p_o) \qquad (4)$$

A value for G and for $n_o$ can be derived from the FIG. 4 results using equations (3) and (4). For the p-type body 10, $p_o$ was $10^{16}$ acceptor levels/cm$^3$. An approximate average conversion rate of $7\times10^{-6}$ cm/sec can be taken from FIG. 4. Thus from equation (3) a value of approximately $7\times10^{10}$ cm$^{-2}$ sec$^{-1}$ is obtained for G. Since in the arrangement used to obtain the results of FIG. 4 the rate at which the part 21 was etched away was approximately $2\times10^{-3}$ microns/sec (equivalent to approximately $3\times10^{15}$ mercury atoms/cm$^2$/sec), G is equivalent in this case to deriving from the etched-away body part 21 for every million mercury atoms removed approximately 20 mercury atoms acting as donors for the conductivity type conversion.

Furthermore by taking approximately $10^{-13}$ cm$^2$ sec$^{-1}$ as a value for D, equation (4) gives the following approximate values for $n_o$, $(7\times10^{19})d$ where d is in microns, or $(3\times10^{20})t$ where t is in minutes.

A strong dependence of the conversion depth d on the ion dose is found. As shown in FIG. 4 and equation (3), the bombardment and etching time t is a most useful parameter to vary so as to obtain different desired conversion depths d, particularly when forming photovoltaic p-n junctions of desired depth in the body 10 rather than converting the whole of the body 10 to n-type.

Figure 5:
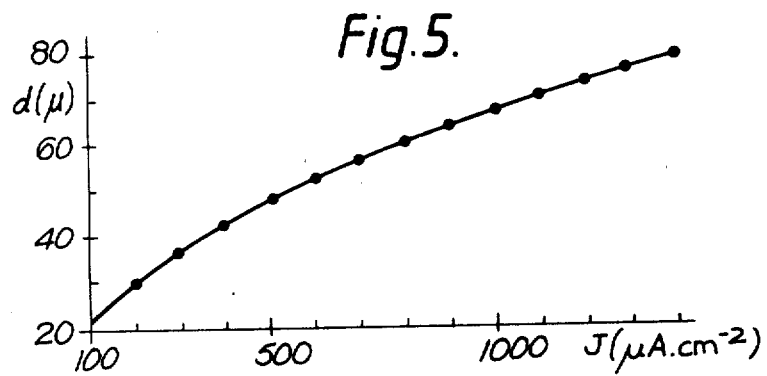
FIG. 5 is a graph showing the variation in the conversion depth (d in microns) with ion beam current density (J in microAmps per cm$^2$).

However, the ion dose may also be varied by varying the ion beam current density J. As shown in FIG. 5 the conversion depth d increases with increased beam current density J which is equivalent to the ion dose per unit time. Thus the depth d increases from approximately 30 microns for 200 microAmps/cm$^2$ (approximately $8 \times 10^{16}$ ions/cm$^2$/min) to approximately 80 microns for 1.4 milliAmps/cm$^2$ (approximately $5 \times 10^{17}$ ions/cm$^2$/min), both values being obtained for the same bombardment time of 12 minutes.

The conversion depth is, of course, also dependent on other parameters. For example, it decreases with increased ion size, so that when using xenon in place of argon the conversion depth (d) was found to be reduced to a fifth of the value obtained with argon ions under otherwise identical conditions. Changing the accelerating voltage for the ion beam 11 may be used to change the beam current available in given ion-beam etching equipment. However, it appears that if the same value of beam current can be used in each case the conversion depth obtained does not appear to be dependant (or at least not strongly dependant) on the energy of the ion beam within the energy ranges useful for ion-etching. When higher energies are used the ions penetrate so deeply in the body that no significant etching occurs at the bombarded surface, and the ion bombardment is no longer effective for conductivity type conversion according to the present invention.

Figure 3:
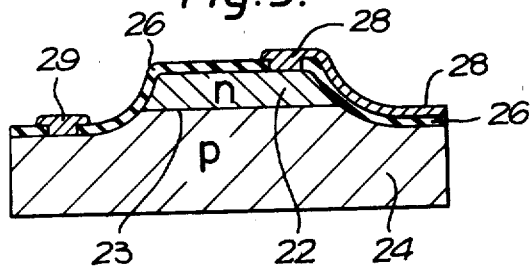
FIG. 3 is a diagrammatic sectional view of an infrared radiation detector device formed from the ion-etched body of FIG. 2.

FIG. 3 illustrates how the body of FIG. 2 may be further processed to form a photovoltaic infrared detector device having the p-n junction 23 as its photosensitive junction. The area of the junction is defined in known manner by mesa-etching using chemical etchant solutions to remove a peripheral part of the n-type region 22 over its whole thickness while masking a central part of the region 22. A passivating layer 26 of, for example, zinc sulphide is then deposited in known manner on the upper surface of the p-type region 24 and on the n-type mesa region 22. Metal layer electrodes 28 and 29 are provided in known manner to contact the regions 22 and 24 respectively at windows formed in the layer 26.

Figure 6:
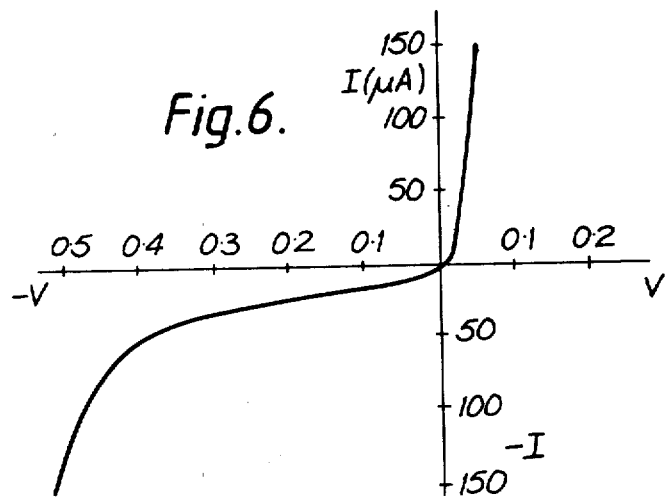
FIG. 6 is a graph of the p-n junction characteristic of a photovolataic detector device manufactured as illustrated in FIGS. 2 and 3.

The current-voltage characteristics of the p-n junction 23 of one example of a photovoltaic infrared detector device manufactured in this way are given in FIG. 6. The graph of FIG. 6 shows the current I in microAmps flowing through the device when a voltage V in volts is applied between its electrodes 28 and 29. The measurements were taken with the device at 77° K., which is its normal operating temperature. The forward characteristic (in which the applied voltage forward biases the junction 23) is shown in the first quadrant of the graph, while the reverse characteristic (junction 23 reverse-biased) is shown in the third quadrant. This detector device was fabricated under the same ion-etching conditions as those used to obtain the results of FIG. 4. The ion-etching time (t) was chosen to give a depth (d) of 10 microns from the p-n junction 23. The n-type mesa region 22 had a diameter of 280 microns. When detecting infrared radiation, the device may either be used without any applied bias voltage or with a reverse bias voltage in the range corresponding to the low-current (i.e. blocking) portion of the reverse characteristic shown in FIG. 6.

Figure 7:
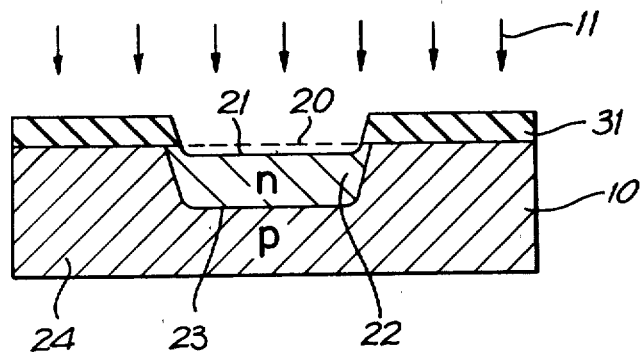
FIG. 7 is a diagrammatic sectional view of part of a body of cadmium mercury telluride being subjected locally to an ion-etching step in another method according to the invention.
Figure 8:
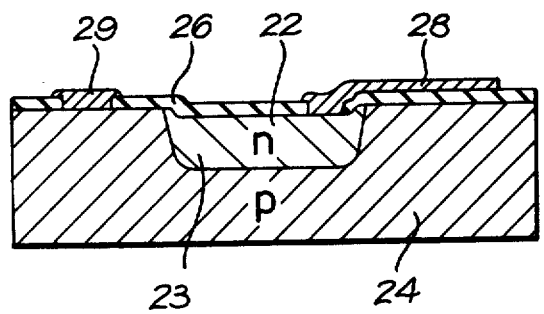
FIG. 8 is a diagrammatic sectional view of an infrared radiation detector device formed from the ion-etched body of FIG. 7.

It will be evident that many modifications are possible within the scope of the invention. Thus, for example, the ion bombardment (and consequently the ion-etching and conversion of conductivity type) can be localized at the surface of the cadmium mercury telluride body 10. Such an arrangement is illustrated in FIG. 7 in which a masking layer 31 (for example of photoresist) is present on the surface of the body 10 to restrict the etching and conductivity-type conversion to an area at a window in the masking layer 31. The use of a photoresist layer to mask locally against ion-etching is described in the previously mentioned DE 2708792, EP 0 007 667, EP 0 007 668 and EP 0 007 669. After etching for a time sufficient to form the p-n junction to the required depth, the masking layer 31 is removed before providing a passivating layer 26 and electrodes 28 and 29 as in the previously described example. The resulting photovoltaic detector structure is illustrated in FIG. 8. A plurality of such detectors can be formed in the body 10.

I claim:

1. A method of manufacturing an infrared radiation detector device of cadmium mercury telluride, comprising the steps of (a) providing a body of cadmium mercury telluride at least a portion of which has conductivity characteristics of p-type material at the operating temperature of the device, and (b) bombarding with ions at least a part of a surface of the body to convert at least a part of said body portion into material having conductivity characteristics of n-type material at the operating temperature of the device, characterized in that the ion bombardment is effected using ion etching to etch away a part of the body at the bombarded surface, and in that the dose, energy and mass of the bombarding ions are such that adjacent the bombarded surface a sufficient excess concentration of mercury is produced from the etched-away part of the body as to act as a dopant source for converting an adjacent part of said body into material having the n-type conductivity characteristics, said ion dose being sufficiently large to convert said adjacent part of the body over a depth greater than twice the penetration depth of said ions in said body, and the energy of the bombarding ions being less than 30 keV.

2. A method as claimed in claim 1, further characterized in that said ion-etching is terminated when a p-n junction of desired depth is formed in the body by the n-type converted part.

3. A method as claimed in claim 2, further characterized in that said p-n junction is formed to a depth of at least 2 microns.

4. A method as claimed in claim 2 or claim 3, further characterized in that during said ion-etching a masking layer is present on said surface of the body and has a window to restrict the etching and conversion to a localized area at said window so forming said p-n junction extending from said surface.

5. A method as claimed in claim 2 or 3, further characterized in that said p-n junction forms the active junction of a photovoltaic infrared radiation detector device.

6. A method as claimed in claim 1, further characterized in that said ion-etching is continued for a time sufficient to convert the remaining part of said body into n-type material across the whole thickness of said body.

7. A method as claimed in claim 4, further characterized in that said p-n junction forms the active junction of a photovoltaic infrared radiation detector device.

8. A method of manufacturing a p-n junction device of cadmium mercury telluride, said method comprising the steps of:

providing a body of cadmium mercury telluride having at least one surface, said body having p-type conductivity at an operating temperature of the device; and bombarding at least a part of the surface with ions to ion-etch away a part of the body at the bombarded surface, the ions penetrating said body to a penetration depth, the dose, energy and mass of the bombarding ions being selected such that an excess concentration of mercury is produced in a part of the body adjacent to the etched-away part of the body, the excess concentration of mercury converting a conversion depth of the body to n-type conductivity at the operating temperature of the device, the ion dose being sufficiently large that the conversion depth is greater than twice the ion penetration depth, the bombarding ions having energies less than 30 keV.

* * * * *